United States Patent
Moran

(10) Patent No.: US 7,372,328 B2
(45) Date of Patent: May 13, 2008

(54) AMPLIFICATION CIRCUIT FOR DRIVING A LASER SIGNAL

(75) Inventor: Timothy G. Moran, San Jose, CA (US)

(73) Assignee: Finisar Coporation, Sunnyvale, CA (US)

( * ) Notice: Subject to any disclaimer, the term of this patent is extended or adjusted under 35 U.S.C. 154(b) by 334 days.

(21) Appl. No.: 11/072,378

(22) Filed: Mar. 4, 2005

(65) Prior Publication Data

US 2005/0195871 A1   Sep. 8, 2005

Related U.S. Application Data

(60) Provisional application No. 60/550,548, filed on Mar. 5, 2004.

(51) Int. Cl.
 *H03F 3/45* (2006.01)
(52) U.S. Cl. .................................. 330/252; 330/69
(58) Field of Classification Search ............... 330/69, 330/252
 See application file for complete search history.

(56) References Cited

U.S. PATENT DOCUMENTS 6,480,067 B1 * 11/2002 Kobayashi et al. ......... 330/254
6,958,650 B1 * 10/2005 Teo ............................ 330/252

* cited by examiner

*Primary Examiner*—Khanh Van Nguyen
(74) *Attorney, Agent, or Firm*—Workman Nydegger

(57) ABSTRACT

A method of filtering a differential signal. The method includes receiving the differential signal. Transitions of the differential signal are accelerated after the differential signal has passed through a cross-over point to create an accelerated differential signal. A delayed differential signal is created that is a delayed version of the accelerated differential signal delayed by a predetermined amount of time with respect to the accelerated differential signal. The accelerated differential signal is amplified to create an amplified accelerated differential signal. The delayed differential signal is amplified to create an amplified delayed differential signal. The amplified delayed differential signal and the amplified accelerated differential signal are combined to create an output signal.

9 Claims, 7 Drawing Sheets

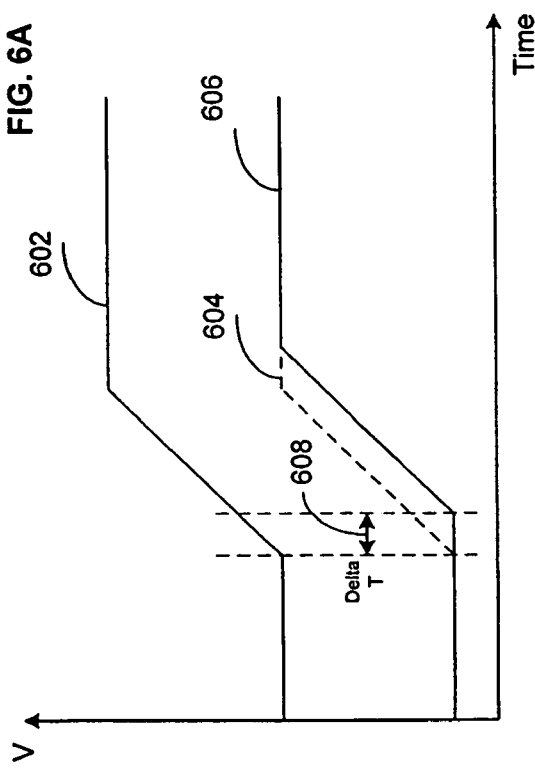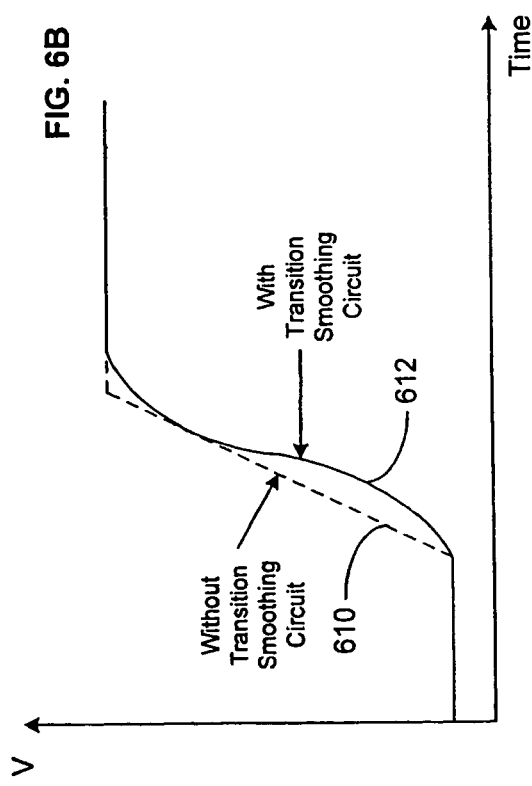

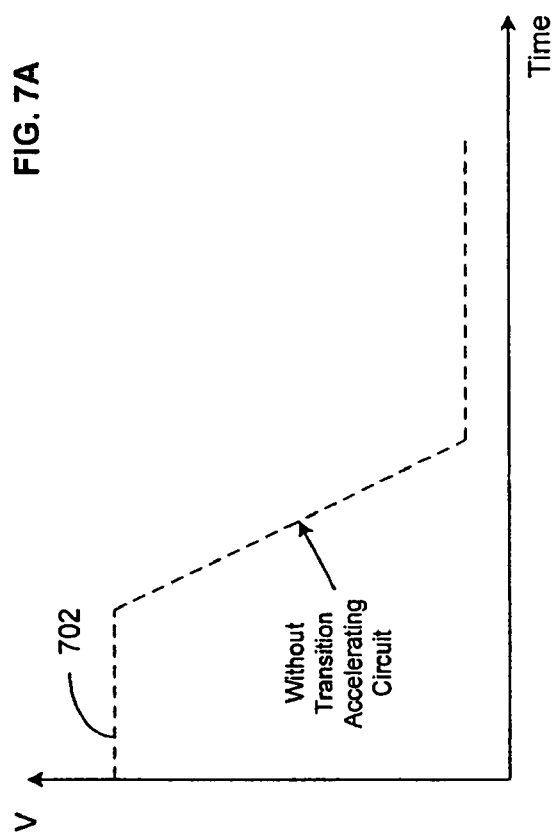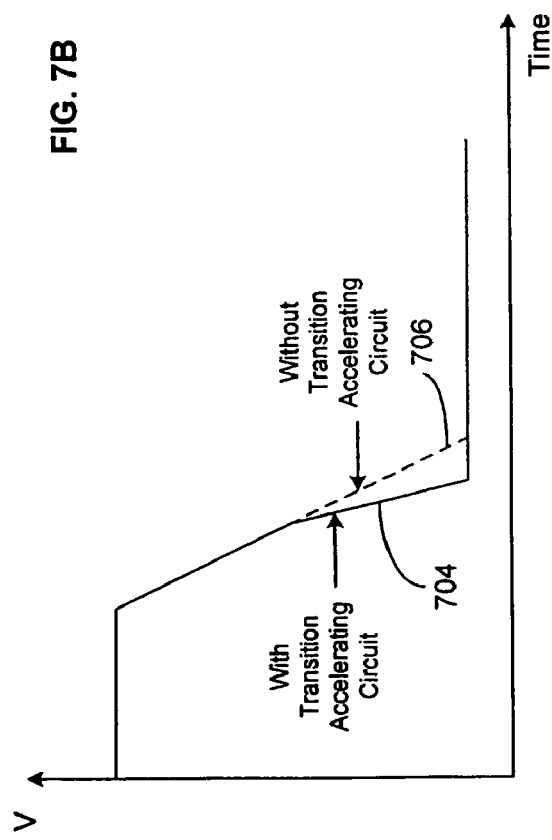

AMPLIFICATION CIRCUIT FOR DRIVING A LASER SIGNAL

CROSS-REFERENCE TO RELATED APPLICATIONS

This application claims priority to U.S. Provisional Application No. 60/550,548, filed Mar. 5, 2004, titled An Amplification Circuit For Driving A Laser Signal which is hereby incorporated by reference in its entirety.

BACKGROUND OF THE INVENTION

1. The Field of the Invention

The present invention relates to the field of high-speed data communications. In particular, the present invention relates to a circuit and method for amplifying a laser signal.

2. Description of the Related Art

In high speed optical communication systems, laser signals may be used to transmit information. For example, a laser signal, transmitted by a remote device, may be detected by a photo detector, amplified by a trans-impedance amplifier circuit, and filtered by a filter circuit. After the laser signal is filtered, it is then amplified by an amplification circuit and converted to a digital format for further processing or storage.

Traditionally, the amplification circuit may be implemented with differential amplifiers consisting of pairs of transistors. One of the design goals of the amplification circuit is to decrease the settling time of the laser signal during a signal transition. This design goal may be accomplished by using a differential amplifier having a higher amplification gain to drive the laser signal in order to ensure a fast signal transition. Another design goal of the amplification circuit is to minimize the electromagnetic interference created by the higher order harmonics of the laser signal during signal transitions. This design goal may be accomplished by using a differential amplifier having a lower amplification gain to drive the laser signal. As a result, a design tradeoff has to be made to choose between having a higher or lower amplification gain. The design is comprised because it has either the adverse effect of electromagnetic interference or lower design margins for signal settling time during signal transitions. The adverse effect of electromagnetic interference may lead to additional system costs employed to reduce the interference problem. The adverse effect of lower design margins for signal settling time may lead to lower signal quality and may also lead to transmission errors.

Therefore, there is a need for a laser amplification circuit which can increase the settling time margin during signal transitions and at the same time minimize the electromagnetic interference generated from such signal transitions.

BRIEF SUMMARY OF THE INVENTION

One embodiment includes an amplification circuit for amplifying a differential pair of input signals. The amplification circuit includes a receiver circuit, a first differential amplifier circuit, a second differential amplifier circuit, a pair of output terminals, and a transition accelerating circuit. The receiver circuit receives the differential pair of input signals. The first differential amplifier circuit is coupled to a pair of output ports of the receiver circuit and generates first and second amplified signals. The second differential amplifier circuit is coupled to the pair of output ports of the receiver circuit through a transition smoothing circuit and generates third and fourth amplified signals. The pair of output terminals includes a first output terminal and a second output terminal. The first output terminal is configured to combine second amplified signal and the fourth amplified signal. The transition accelerating circuit is coupled to the pair of output ports of the receiver circuit, and speeds up the rate of signal change at the pair of output terminals during the predetermined period of signal transition.

Another embodiment includes a method of filtering a differential signal. The method includes receiving the differential signal. Transitions of the differential signal are accelerated after the differential signal has passed through a cross-over point to create an accelerated differential signal. A delayed differential signal is created that is a delayed version of the accelerated differential signal delayed by a predetermined amount of time with respect to the accelerated differential signal. The accelerated differential signal is amplified to create an amplified accelerated differential signal. The delayed differential signal is amplified to create an amplified delayed differential signal. The amplified delayed differential signal and the amplified accelerated differential signal are combined to create an output signal.

These and other features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 6A illustrates output waveforms of the first and second differential amplifiers of FIG. 5A.

FIG. 6B compares combined output waveforms of the first and second differential amplifiers of FIG. 6A with and without the transition smoothing circuit.

FIG. 7A illustrates an output signal transition of the accelerating amplifier circuit without the transition accelerating circuit 512.

FIG. 7B compares output signals of the accelerating amplifier circuit with and without the transition accelerating circuit.

DETAILED DESCRIPTION OF THE INVENTION

Figure 1:
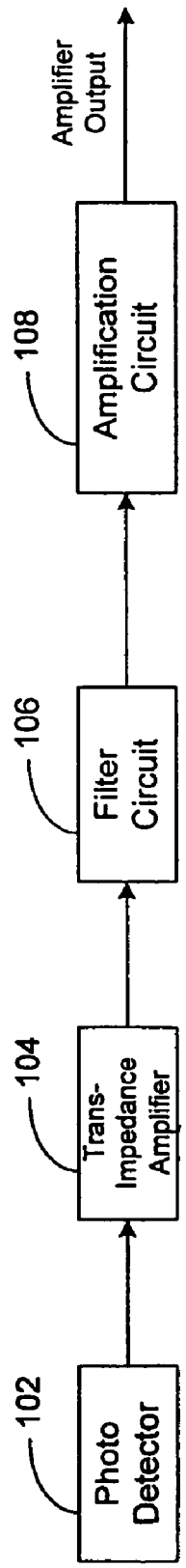
FIG. 1 illustrates a sub-system for processing a received optical laser signal.

FIG. 1 illustrates a sub-system for processing a received optical laser signal. Information carried in the received optical laser signal is first detected by a photo detector 102 and converted into an electronic signal format as a pair of differential signals. The differential signals are then processed and transmitted by a trans-impedance amplifier 104 to a filter circuit 106. The purpose of the filter circuit 106 is to filter out noise as well as to filter out higher order harmonics in the input laser signal. The noise and higher order harmonics may degrade the laser signal quality and generate undesirable electromagnetic interference in the system. The filter circuit 106 may be designed to filter or not filter the input signal from the trans-impedance amplifier 104, hence it may send a filtered laser signal and a unfiltered laser signal to an amplification circuit 108 in the next stage. The output of the filter circuit 106 is sometimes herein called the input laser signal, as distinguished from the optical laser signal received by the photo detector 102. The amplifcation circuit 108 may select either the filtered or unfiltered input laser signal, switch the polarity of the input laser signal, and amplify the input laser signal to a desired signal level for further processing or storage.

Figure 2:
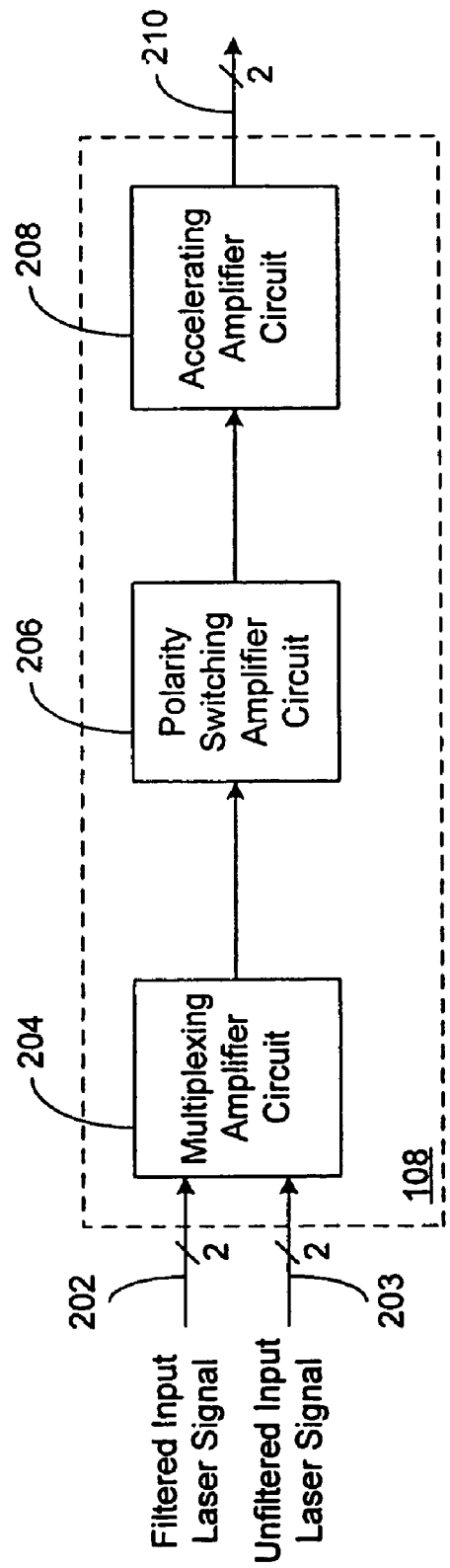
FIG. 2 illustrates an implementation of the amplification circuit 108 of FIG. 1.

FIG. 2 illustrates an implementation of the amplification circuit 108 of FIG. 1. The inputs to the amplification circuit 108 receive a filtered input laser signal 202 and a unfiltered input laser signal 203. The amplification circuit includes a multiplexing amplifier circuit 204, a polarity switching amplifier circuit 206, an accelerating amplifier circuit 208, and an output laser signal 210. The multiplexing amplifier circuit 204 receives the filtered and unfiltered input laser signals 202, 203. It then selects either the filtered 202 or unfiltered 203 input laser signals in accordance with a predetermined set of multiplexor control signals. The polarity switching amplifier circuit 206 receives the output of the multiplexing amplifier circuit 204. It generates either an inverting or a non-inverting version of the received signal in accordance with a predetermined set of polarity control signals. The accelerating amplifier circuit 208 receives the output of the polarity switching amplifier circuit 206. It amplifies the received input signal and generates the output laser signal 210.

Figures 3A, 3B:
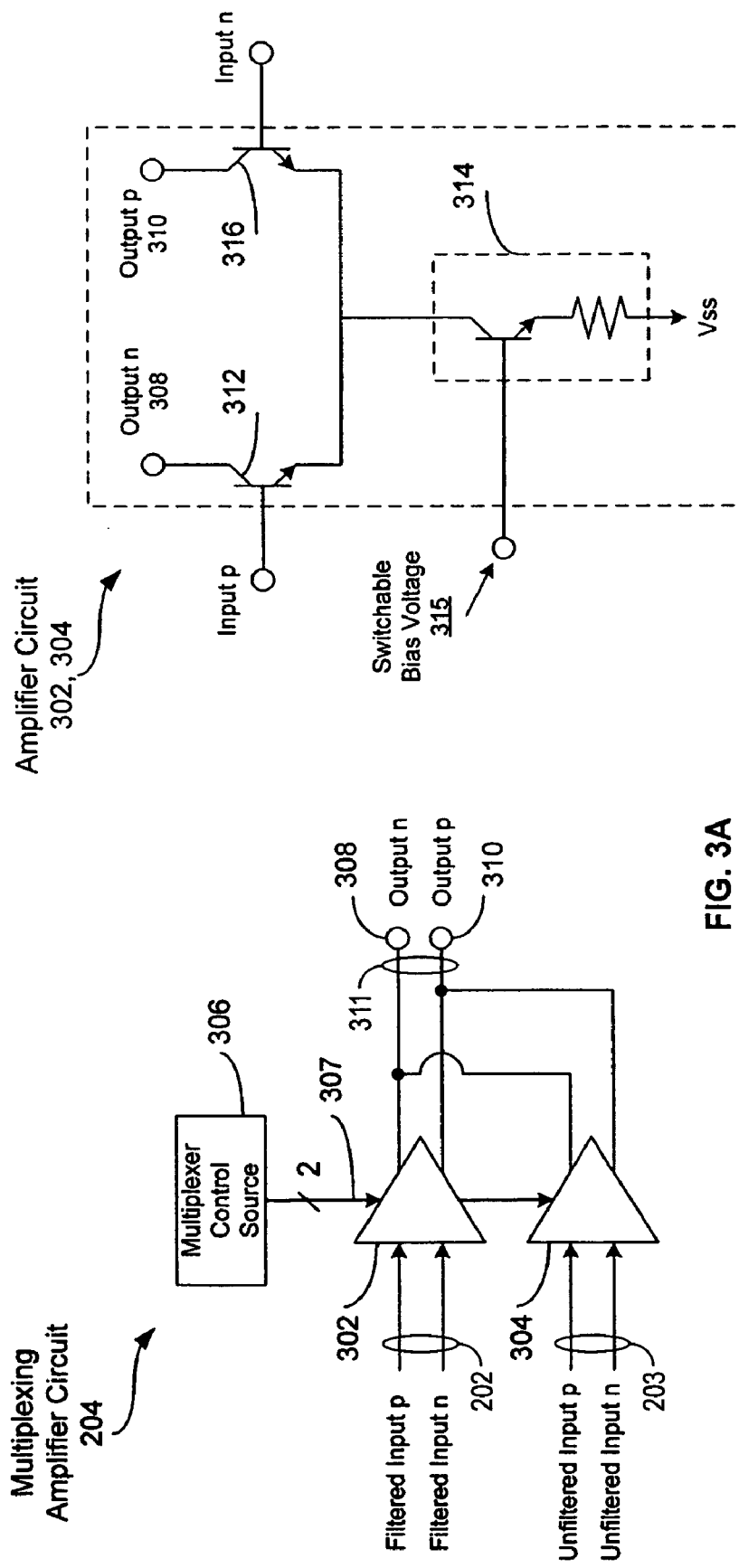
FIG. 3A illustrates a block diagram of the multiplexing amplifier circuit of FIG. 2.
FIG. 3B illustrates an implementation of one of the differential amplifiers of the multiplexing amplifier circuit.

FIG. 3A illustrates a block diagram of the multiplexing amplifier circuit 204 of FIG. 2. The circuit includes a first differential amplifier 302 which receives a differential pair of filtered input laser signals 202, and a second differential amplifier 304 which receives a differential pair of unfiltered input laser signals 203. Both the first and second differential amplifiers 302, 304 are controlled by a multiplexor control source 306 which generates a set of multiplexor control signals 307. The multiplexor control signals 307 either turn on the first differential amplifier 302 and turn off the second differential amplifier 304, or alternatively turn off the first differential amplifier 302 and turn on the second differential amplifiers 304. The outputs of the first and second differential amplifiers 302, 304 are combined at a first output port 308 (Output n) and a second output port 310 (Output P) to form a multiplexing amplifier circuit output 311. Since only one of the differential amplifiers 302 or 304 is turned on at a time, either the filtered input laser signal 202 or the unfiltered input laser signal 203 is selected, amplified and transmitted to the output ports 308, 310 of the multiplexing amplifier circuit 204.

FIG. 3B illustrates an implementation of one of the differential amplifiers 302, 304 of FIG. 3A. The differential amplifier includes a first transistor 312 having a base terminal coupled to a first input port (Input p), which may be, for example, filtered input p of the filtered input laser signal 202, a collector terminal coupled to the first output port 308 (Output n) and an emitter terminal coupled to a current source 314. The differential amplifier further includes a second transistor 316 having a base terminal coupled to a second input port (Input n), which may be, for example, filtered input n of the filtered input laser signal 202, a collector terminal coupled to the second output port 310 (Output p) and an emitter terminal coupled to the current source 314. Both the first and second differential amplifiers 302, 304 have similar circuit structures, except the multiplexing control signals 307 which drive the switchable bias voltage signals for the differential amplifiers are non-overlapping signals. For example, when the switchable bias voltage signal for the first differential amplifier 302 is asserted, the corresponding switchable bias voltage signal for the second differential amplifier 304 is deasserted. These non-overlapping switchable bias voltage signals ensure the first and second differential amplifiers 302, 304 do not turn on at the same time. As a result, only one of the input signals 202, 203 is selected and transmitted to the output ports 308 and 310 of the multiplexing amplifier circuit 204.

Figure 4:
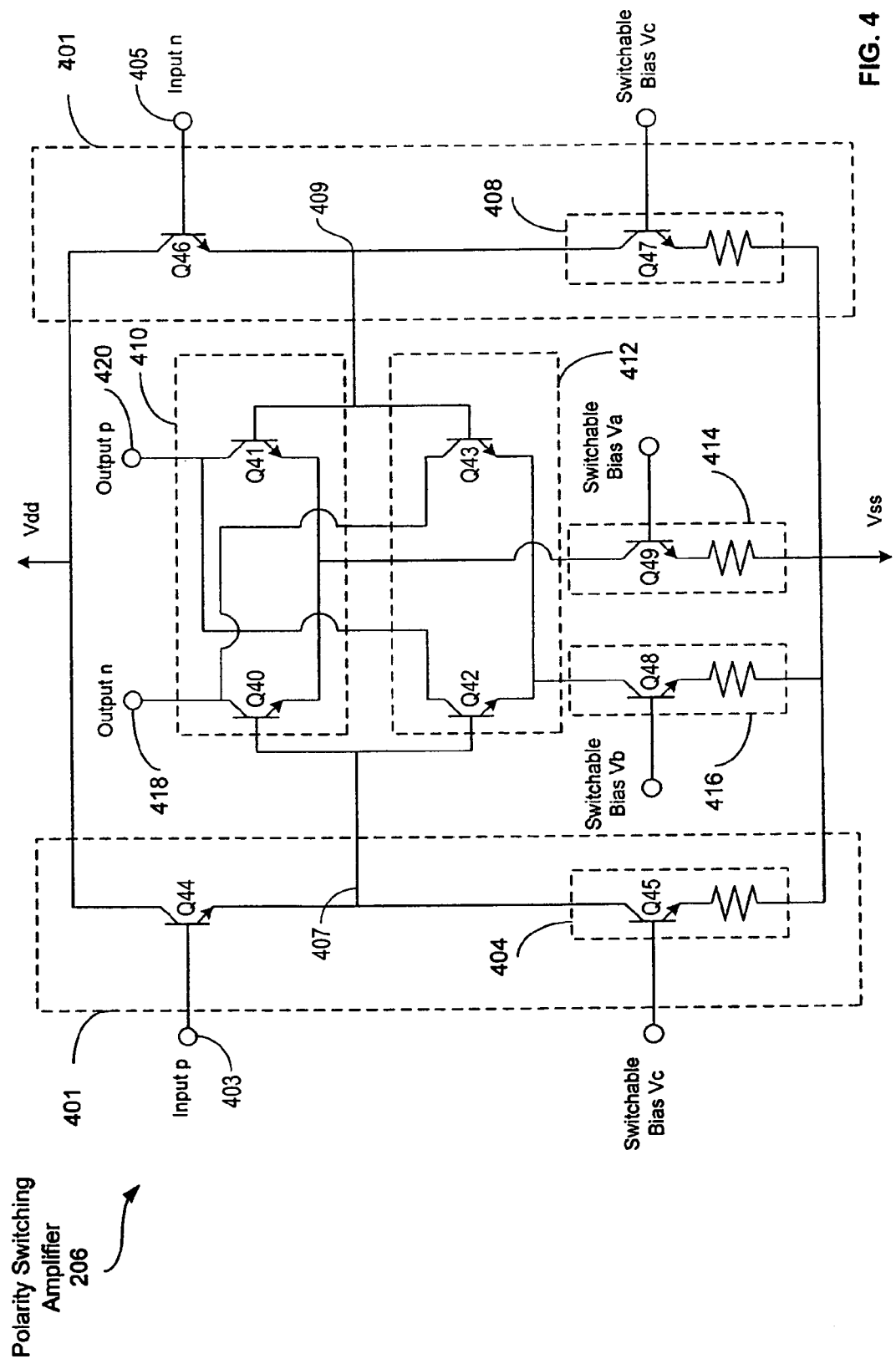
FIG. 4 illustrates an implementation of the polarity switching amplifier circuit FIG. 2.

FIG. 4 illustrates an implementation of the polarity switching amplifier circuit 206 of FIG. 2. The polarity switching amplifier circuit 206 includes a buffer circuit 401 that receives the multiplexing amplifier circuit output signals 311 from the output ports 308, 310 of the multiplexing amplifier circuit 204 (FIG. 3A). The buffer circuit 401 includes a first transistor Q44, a first bias current source 404, a second transistor Q46 and a second bias current source 408. The first transistor Q44 has a base terminal coupled to a first input 403 (Input p) of the buffer circuit 401, a collector terminal coupled to a power supply Vdd, and an emitter terminal coupled to the first bias current source 404. The second transistor Q46 has a base terminal coupled to a second input 405 (Input n) of the buffer circuit 401, a collector terminal coupled to the power supply Vdd, and an emitter terminal coupled to the second bias current source 408.

The polarity switching amplifier circuit 206 also includes a first differential amplifier circuit 410 formed with transistors Q40 and Q41, a third switchable bias current source 414, and a pair of output terminals 418 and 420. The first differential amplifier 410 receives its input signals from the buffer circuit 401 at nodes 407 and 409 and generates a first amplified signal Output n at output terminal 418 and a second amplified Output p signal at output terminal 420 in response to the input signals received. The transistor Q40 has a base terminal coupled to a first output port (node 407) of the buffer circuit 401, a collector terminal coupled to the first output terminal 418 (Output n), and an emitter terminal coupled to the third switchable bias current source 414. The transistor Q41 has a base terminal coupled to the second output port (node 409) of the buffer circuit 401, a collector terminal coupled to the second output terminal 420 (Output p), and an emitter terminal coupled to the emitter terminal of the transistor Q40 and to the third switchable bias current source 414 that is enabled by a bias signal Va.

The polarity switching amplifier circuit 206 further includes a second differential amplifier circuit 412 formed with transistors Q42 and Q43, and a fourth switchable bias current source 416 that is enabled by a bias signal Vb. The second differential amplifier circuit 412 receives its input signals from the buffer circuit 401 at nodes 407 and 409 and generates a third amplified signal and a fourth amplified signal in response to the input signals received. The transistor Q42 has a base terminal coupled to the first output port (node 407) of the buffer circuit 401, a collector terminal coupled to the second output terminal 420 (Output p), and an emitter terminal coupled to the fourth switchable bias current source 416. The transistor Q43 has a base terminal coupled to a second output port (node 409) of the buffer circuit 401, a collector terminal coupled to the first output terminal 418 (Output n), and an emitter terminal coupled to the emitter terminal of the transistor Q42 and to the fourth switchable bias current source 416. Similar to the multiplexing control signals 307 of the multiplexing amplifier circuit 204 (FIG. 3A), the polarity switching control signals which drive the switchable bias voltage signals Va and Vb are non-overlapping signals. These non-overlapping signals ensure the first and second differential amplifiers 410 and 412 do not turn on at the same time and therefore either an inverting or a non-inverting output signal is selected and transmitted to the output terminals 418 and 420 of the polarity switching amplifier circuit.

The pair of output terminals 418, 420 includes the first output terminal 418 and the second output terminal 420. The first output terminal 418 is configured to combine the first and fourth amplified signals, and the second output terminal 420 is configured to combine the second and third amplified signals. Note that the output of the first differential amplifier 410 is non-inverting, and the output of the second differential amplifier 412 is inverting. By selectively enabling either the first or the second differential amplifier 410, 412, the polarity switching amplifier circuit 206 generates either an inverting or a non-inverting output signal.

Figure 5A:
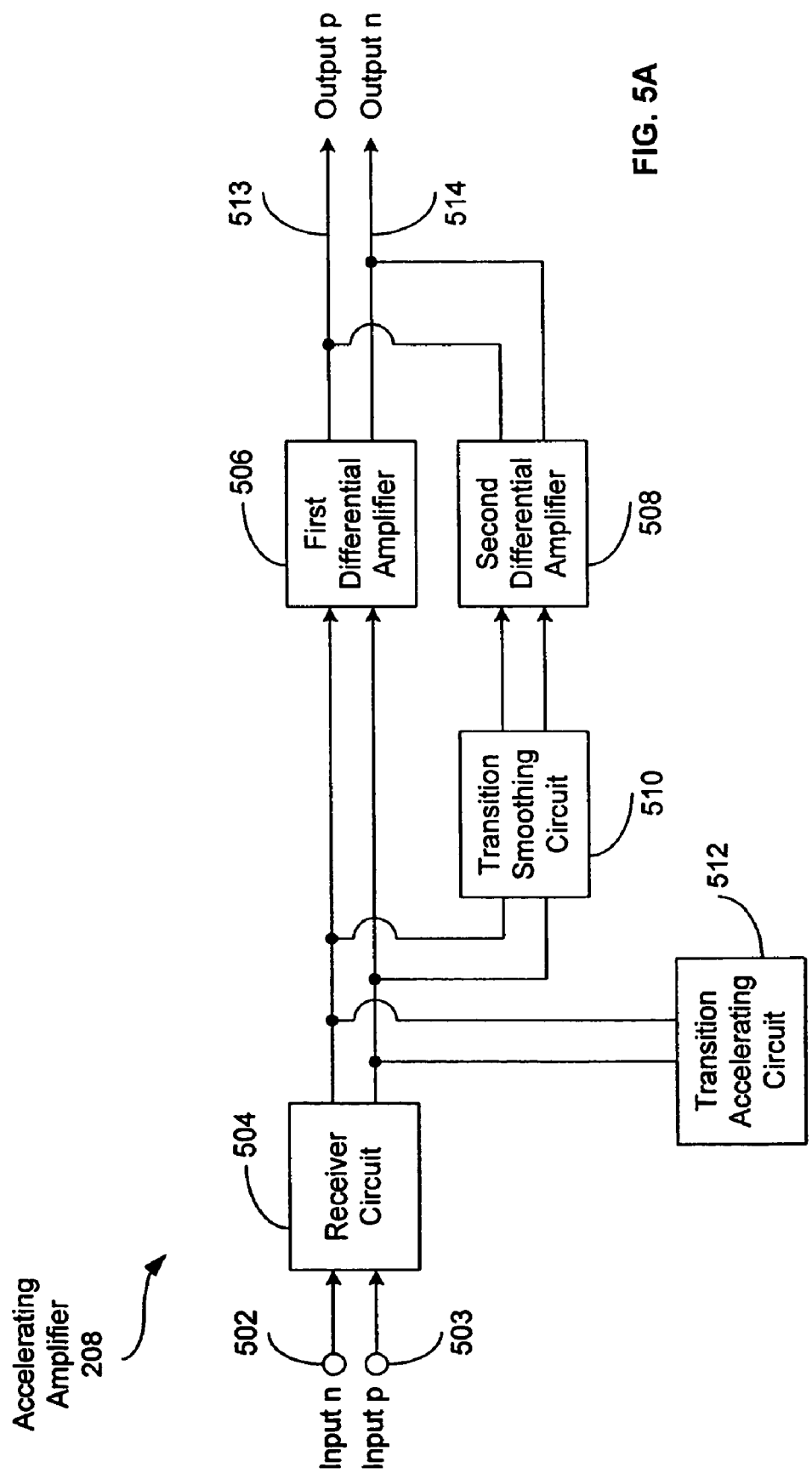
FIG. 5A illustrates a block diagram of the accelerating amplifier circuit of FIG. 2.

FIG. 5A illustrates a block diagram of the accelerating amplifier circuit 208 of FIG. 2. The accelerating amplifier circuit 208 includes a pair of input terminals 502 and 503, a receiver circuit 504, a first differential amplifier circuit 506, a second differential amplifier circuit 508, a transition smoothing circuit 510, a transition accelerating circuit 512 and a pair of output terminals 513 and 514. The receiver circuit 504 receives a pair of input signals from the input terminals 502 and 503. The first differential amplifier circuit 506 is coupled to the receiver circuit 504 and generates a first amplified signal and a second amplified signal. The second differential amplifier circuit 508 is coupled to the receiver circuit 504 through the transition smoothing circuit 510, and it generates a third amplified signal and a fourth amplified signal. The pair of output terminals 513, 514 drive a first output signal output p and a second output signal output n. The output terminal 513 is configured to combine the first amplified signal and the third amplified signal, and the second output terminal 514 is configured to combine the second amplified signal and the fourth amplified signal. The transition accelerating circuit 512 is coupled to the input ports of the first differential amplifier 506 and to the input ports of the transition smoothing circuit 510. The transition accelerating circuit 512 is configured to speed up signal transitions of the pair of differential output signals from the receiver circuit 504.

Figure 5B:
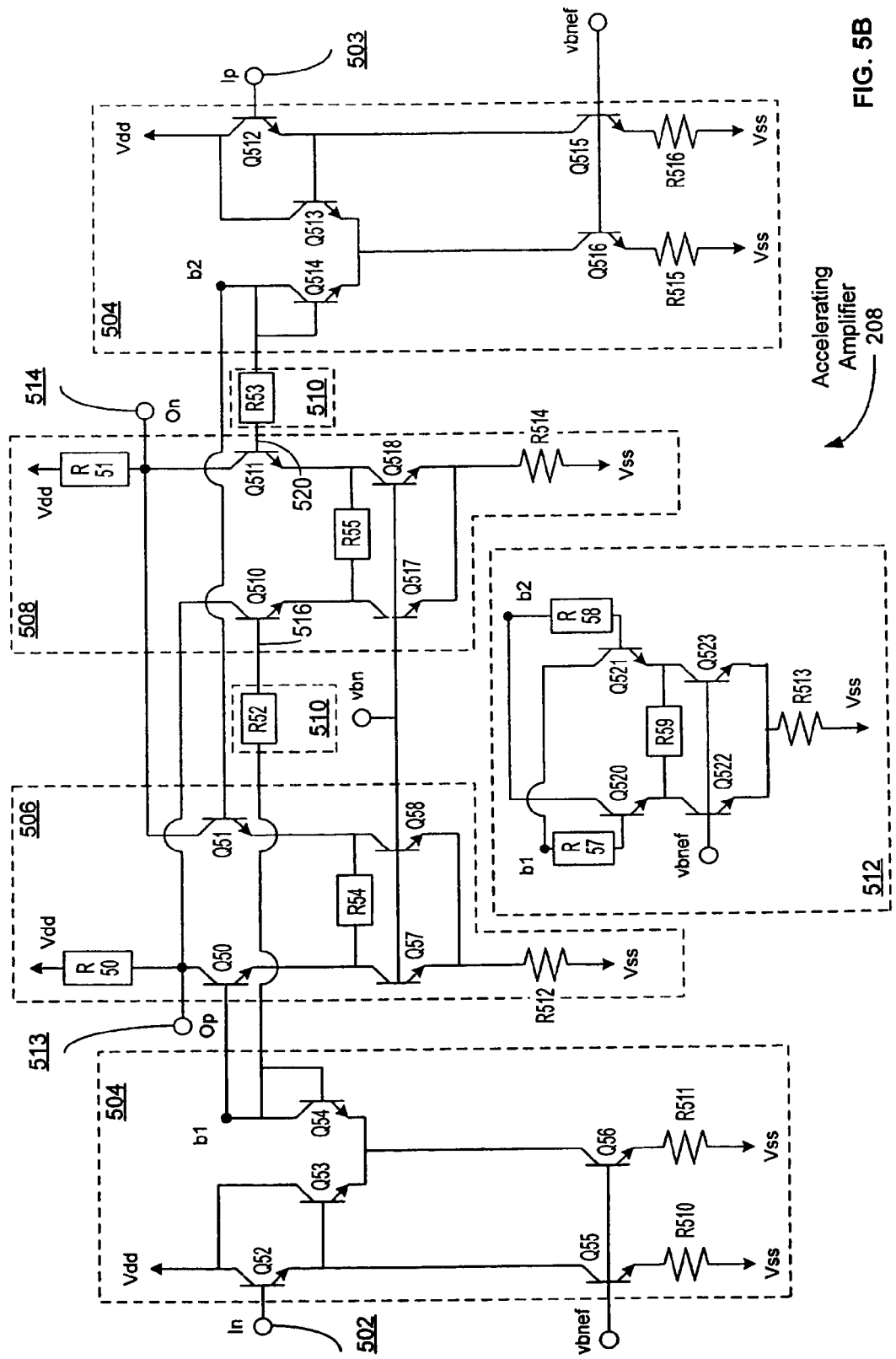
FIG. 5B illustrates an implementation of the accelerating amplifier circuit of FIG. 5A.

FIG. 5B illustrates an implementation of the accelerating amplifier circuit 512 of FIG. 5A. The receiver circuit 504 includes a negative signals path and a positive signal path. The negative signal path is formed with transistors Q52, Q53, Q54, a first bias current source formed with transistor Q55 and resistor R510, and a second bias current source formed with transistor Q56 and resistor R511. The transistor Q52 has a base terminal couple to a first input terminal 502 of the receiver circuit 504, a collector terminal coupled to a power supply Vdd, and an emitter terminal coupled to the first bias current source formed with transistor Q55 and resistor 510. The transistor Q53 has a base terminal coupled to the emitter terminal of the transistor Q52, a collector terminal coupled to the collector of the transistor Q52, and an emitter terminal coupled to the second bias current source formed with transistor Q56 and R511. The transistor Q54 has a collector terminal coupled to a first output port (b1) of the receiver circuit 504, a base terminal coupled to the collector terminal of transistor Q54, and an emitter terminal coupled to the emitter terminal of the transistor Q53.

Similarly, the positive signal path is formed with transistor Q512, Q513, and Q514, a third bias current source formed with transistor Q515 and resistor R516, and a fourth bias current source formed with transistor Q516 and resistor R515. The transistor Q512 has a base terminal coupled to a second input terminal (Ip) of the receiver circuit, a collector terminal coupled to the power supply, and an emitter terminal coupled to the third bias current source. The transistor Q513 has a base terminal coupled to the emitter terminal of the transistor Q512, a collector terminal coupled to the collector of the transistor Q512, and a base terminal coupled to the fourth bias current source. The transistor Q514 has a collector terminal coupled to a second output port (b2) of the receiver circuit, a base terminal coupled to the collector terminal of transistor Q514, and an emitter terminal coupled to the emitter terminal of the transistor Q513 and to the fourth bias current source including transistor Q516 and resistor R515.

Amplifier circuit 512 accelerates signal transitions at nodes b1 and b2, but only after the signals at these nodes have passed through a transistion or cross-over point. As a result, the switching of the signals on nodes b1 and b2 starts out "slow" (thereby creating very little electromagnetic noise), and then speeds up to complete the transition before a next bit time. As a result, the processing of the differential input signal (Ip and In) is completed at high speed, within a low timeframe, but without generating large amounts of electromagnetic noise.

The first differential amplifier 506 of FIGS. 5A and 5B includes transistors Q50 and Q51, a resistor network R54, a first bias current source formed with transistor Q57 and resistor R512, and a second bias current source formed with transistor Q58 and resistor R512. The transistor Q50 has a base terminal coupled to a first output port of the receiver circuit 504 and to a first output port (b1) of the transition accelerating circuit 512, a collector terminal coupled to a power supply Vdd through a resistor network R50 and to a first output port 513 of the accelerating amplifier circuit, and an emitter terminal coupled to the first bias current source including transistor Q57 and resistor R512. The transistor Q51 has a base terminal coupled to a second output port of the receiver circuit and to a second output port (b2) of the transition accelerating circuit 512, a collector terminal coupled to the power supply Vdd through a resistor network R51 and to a second output port 514 of the accelerating amplifier circuit, and an emitter terminal coupled to the emitter terminal of the transistor Q50 through the resistor network R54 and to the second bias current source including transistor Q58 and resistor R512. The resistor networks R50, R51, and R54 include one or more resistors connected in series or in parallel.

The transition smoothing circuit 510 of FIGS. 5A and 5B includes a resistor network R52 and a resistor network R53. Both resistor networks R52 and R53 include one or more resistors connected in series or in parallel. The resistor network R52 is coupled between the first output port of the receiver circuit 504, which is also the first output port (b1) of the transition accelerating circuit 512 and the first input port 516 of the second differential amplifier circuit 508. The resistor network R52 produces a predetermined time shift at the first input port 516 of the second differential amplifier circuit 508. Similarly, the resistor network R53 is coupled between the second output port and the receiver circuit 504, which is also the second output port (b2) of the transition accelerating circuit 512, and the second input port 520 of the second differential amplifier circuit 508. The resistor network R3 produces a predetermined time shift at the second input port 520 of the second differential amplifier circuit 508.

The second differential amplifier 508 of FIGS. 5A and 5B includes transistors Q510 and Q511, a resistor network R55, a third bias current source formed with transistor Q517 and resistor R514, and a fourth bias current source formed with transistor Q518 and resistor R514. The transistor Q510 has a base terminal coupled to a first output port of the transition smoothing circuit 510, a collector terminal coupled to the power supply dd through the resistor network R50 and to the first output port 513 of the transition accelerating amplifier circuit 512 and an emitter terminal coupled to the third bias current source including transistor Q517 and resistor R514. The transistor Q511 has a base terminal coupled to a second output port of the transition smoothing circuit 510, a collector terminal coupled to the power supply through Vdd the resistor network R51 and to the second output port 514 of the second differential amplifier 508, and an emitter terminal coupled to the emitter terminal of the transistor Q510 through the resistor network R55 and to the fourth bias current source (Q518, R514). The resistor network R55 includes one or more resistors connected in series or in parallel.

The transition accelerating circuit 512 of FIGS. 5A and 5B includes transistors Q520 and Q521, a resistor network R57, a resistor network R58, a resistor network R59, a first bias current source formed with transistor Q522 and resistor R513, and a second bias current source formed with transistor Q522 and resistor R513. The transistor Q520 has a collector terminal coupled to a second output port (b2) of the transition accelerating circuit 512, a base terminal coupled to a first output port (b1) of the transition accelerating circuit 512 through the resistor network R57, and an emitter terminal coupled to the first bias current source (Q522, R513). The transistor Q521 has a collector terminal coupled to the first output port (b1) of the transition accelerating circuit 512 a base terminal coupled to the second output port (b2) of the transition accelerating circuit 512 through the resistor network R58, and an emitter terminal coupled to the second bias current source (Q23, R13) and to the emitter terminal of the transistor Q520 through the resistor network R59. The resistor networks R57, R58, and R59 each include one or more resistors connected in series or in parallel.

The transition acceleration circuit 512 speeds up signal transitions at the output ports 513, 514 of the accelerating amplifier 208. In one embodiment, when the input signal at the base terminal of transistor Q50 switches from low to high and the input signal at the base terminal of transistor Q51 switches from high to low, the transistor Q50 is caused to turn on and the transistor Q51 is caused to turn off. As a result, the output signal at the first output port 513 (Op) of the accelerating amplifier circuit transitions form high to low as this node is pulled low through the first bias current source (Q57, Q512). The second output port 514 (On) of the accelerating amplifier circuit transitions from low to high as this node is pulled high through the resistor network R51. For the transition accelerating circuit 512, when the input signal at the base terminal of transistor Q520 switches from high to low, the transistors Q20 and Q521 behave in a similar fashion as the transistors Q50 and Q51, respectively, expect that the output signals of the transition accelerating circuit 512 are delayed by the resistor networks R57 and R58. When transistor Q520 turns on, current is drawn from the base terminal of the transistor Q51, which enhances the switching of the input signal at the base terminal of transistor Q51 from high to low, which in turn turns off the transistor Q51 faster and therefore pulls up the second output port 514 (On) faster. Similarly, when Q521 turns off, less current is drawn from the base terminal of transistor Q50, which enhances the switching of the input signal at the base terminal of transistor Q50 from low to high faster, which in turn turns on the transistor Q50 faster and therefore pulls down the first output port 513 faster. Note that the transition accelerating circuit 512 functions in a similar manner when the input signals at the base terminal of transistor Q50 switches from high to low and the input signal at the base terminal of transistor Q51 switches from low to high. Also note that the transition accelerating circuit 512 has a similar effect on the second differential amplifier 508 as on the first differential amplifier circuit 506, except that such effects are delayed by the transition smoothing circuit 510.

FIG. 6A illustrates output waveforms of the first and second differential amplifiers of FIGS. 5A and 5B. Curve 602 represents an output of the first differential amplifier circuit 506. Curve 604, which is a dotted line, represents a corresponding output of the second differential amplifier circuit 508 if the accelerating amplifier circuit 208 does not include the transition smoothing circuit 510. Curve 606 represents a corresponding output of the second differential amplifier circuit 508 if the accelerating amplifier circuit includes the transition smoothing circuit 510. Note that the output signal represented by curve 606 is delayed by a predetermined amount of time with respect to the signal represented by curve 604. The time difference between curve 604 and 606 is represented by Delta T 608, which is due to the delay to the input signals of the second differential amplifier circuit 508 generated by the transition smoothing circuit 510.

FIG. 6B compares combined output waveforms of the first and second differential amplifiers of FIGS. 5A and 5B with and without the transition smoothing differential amplifiers of FIGS. 5A and 5B with and without the transition smoothing circuit. Curve 610, which is a dotted line, represents one of the output signals of the accelerating amplifier circuit 208 when operating without the transition smoothing circuit 510. The curve 610 represents a sum of the output signals 602 and 604 generated by the first and second differential amplifier circuit 506 and 508, respectively. Although the combined output signal represented by curve 610 is produced by a high amplification gain, this combined signal includes undesired higher order harmonics at the beginning and end of the signal transition due to the simultaneous switching of both the first and second differential amplifiers.

Curve 612 represents one of the output signals of the accelerating amplifier circuit 208 when operating with the transition smoothing circuit 510. In one embodiment, at the beginning of a signal transition when the first differential amplifier circuit 506 is on and the second differential amplifier circuit 508 is not yet on due to the delay of the transition smoothing circuit 510, the output signal switches at a rate of the output signal of the first differential amplifier circuit 510 alone. Similarly, at the end of a signal transition when the first differential amplifier circuit 506 is off and the second differential amplifier circuit 508 alone. During the period when both the first and second differential amplifier circuits are on, the output signal switches at a combined rate of the outputs of the first and second differential amplifier circuits 506, 508. As a result the combined output signal (represented by curve 612) has fewer undesirable higher order harmonics at the beginning and the end of a signal transition, and therefore the electromagnetic interference generated by the simultaneous switching of the first and second differential amplifiers 506, 508 (FIGS. 5A and 5B) is reduced.

FIG. 7A and FIG. 7B together illustrate the benefit of the transition accelerating circuit 512 (FIGS. 5A and 5B). In particular, curve 702 in FIG. 7A represents an output signal transition of the accelerating amplifier circuit 208 without the transition accelerating circuit 512. This output signal is a combination of the output signals generated by the first and second differential amplifiers 506 and 508.

FIG. 7B compares output signals of the accelerating amplifier circuit 208 with and without the transition accelerating circuit 512. Curve 704 represents one of the output signals of the accelerating amplifier circuit 208 operating with the transition accelerating circuit 512. Curve 706, which is a dotted line and is the same as curve 702 in FIG. 7A, represents the output signal of the accelerating amplifier circuit 208 operating without the transition accelerating circuit 512. Note that curve 704 accelerates its rate of transition during the period of a signal transition and therefore it finishes the signal transition faster than the curve 706. Hence, a benefit of the transition accelerating circuit 512 is that it allows the laser signal more settling time for a signal transition. In other words, it ensures a better "eye quality" of the output laser signal and provides more margin for sampling the output laser signal at the next stage.

One skilled in the relevant art will recognize that there are many possible modifications of the disclosed embodiments that could be used, while still employing the same basic underlying mechanisms and methodologies. For example, different types of transistors, such as FET or MOS transistors, may be used to implement the amplification circuit. One or more pairs of differential amplifiers may be used and combined to drive the output laser signal.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An amplification circuit for amplifying a differential pair of input signals, comprising:
    a receiver circuit configured to receive the differential pair of input signals;
    a first differential amplifier circuit coupled to a pair of output ports of the receiver circuit, wherein the first differential amplifier circuit is configured to generate a first amplified signal and a second amplified signal;
    a second differential amplifier circuit coupled to the pair of output ports of the receiver circuit through a transition smoothing circuit, wherein the second differential amplifier circuit is configured to generate a third amplified signal and a fourth amplified signal;
    a pair of output terminals including a first output terminal and a second output terminal, wherein the first output terminal is configured to combine the first amplified signal and the third amplified signal, and the second output terminal is configured to combine the second amplified signal and the fourth amplified signal; and
    a transition accelerating circuit coupled to the pair of output ports of the receiver circuit, wherein the transition accelerating circuit is configured to speed up a rate of signal change at the pair of output terminals during a predetermined period of signal transition.

2. The circuit of claim 1, wherein the amplification circuit is coupled to a filter circuit from which the differential pair of input signals are received, and wherein the filter circuit is coupled to a trans-impedance amplifier configured to transmit a pair of differential signals, and wherein the trans-impedance amplifier is coupled to a photo-detector configured to receive an optical laser signal.

3. The circuit of claim 1, wherein the amplification circuit is coupled to a polarity switching amplifier circuit which is coupled to a multiplexing amplifier circuit.

4. The circuit of claim 3, wherein the multiplexing amplifier circuit is coupled to a filter circuit and wherein the multiplexing amplifier circuit receives a filtered input laser signal and an unfiltered input laser signal.

5. The circuit of claim 3, wherein the polarity switching amplifier circuit comprises:
    a buffer circuit configured to receive a differential pair of input signals from the multiplexing amplifier circuit, the buffer circuit configured to be coupled to first and second switchable bias current sources;
    a first differential amplifier circuit configured to receive the differential pair of input signals from the buffer circuit and to generate first and second amplified signals;
    a second differential amplifier circuit configured to receive the differential pair of input signals from the buffer circuit and to generate third and fourth amplified signals, the second differential amplifier circuit configured to be coupled to third and fourth switchable bias current sources;
    a first output node configured to combine the first and fourth amplified signals; and
    a second output node configured to combine the second and third amplified signals, wherein the combined signals are provided to the amplification circuit as the differential pair of input signals.

6. The circuit of claim 4, wherein the multiplexing amplifier circuit comprises:
    a first differential amplifier configured to receive the filtered input laser signal;
    a second differential amplifier configured to receive the unfiltered input laser signal;
    a multiplexer control circuit configured to generate a control signal for turning on and off the first and second differential amplifiers; and
    an output node configured to combine the output signals of the first and second differential amplifiers.

7. A method for amplifying a differential pair of input signals, comprising:
    receiving the differential pair of input signals;

generating a first amplified signal and a second amplified signal in response to the differential pair of input signals;

generating a third amplified signal and a fourth amplified signal in response to the differential pair of input signals;

combining the first amplified signal and the third amplified signal to form a first differential output signal;

combining the second amplified signal and the fourth amplified signal to form a second differential output signal, wherein the first and second differential output signals form a differential output signals; and speeding up a rate of signal change of the pair of differential output signals during a predetermined period of signal transition;

wherein the step of receiving comprises:

buffering a first input of the differential pair of input signals with a first emitter follower circuit and biasing the first emitter follower circuit with a first bias current source; and buffering a second input of the differential pair of input signals with a second emitter follower circuit and biasing the second emitter follower circuit with a second bias current source.

8. The method of claim 7, wherein generating a first amplified signal and a second amplified signal comprises:

amplifying the differential pair of input signals received with a first differential amplifier circuit; and biasing the first differential amplifier circuit with a third bias current source.

9. The method of claim 8, wherein generating a third amplified signal and a fourth amplified signal comprises:

delaying the pair of differential input signals received with a corresponding pair of resistor networks;

amplifying the pair of differential amplifier circuit with a fourth bias current source.

* * * * *

UNITED STATES PATENT AND TRADEMARK OFFICE
CERTIFICATE OF CORRECTION

PATENT NO.       : 7,372,328 B2
APPLICATION NO.  : 11/072378
DATED            : May 13, 2008
INVENTOR(S)      : Moran It is certified that error appears in the above-identified patent and that said Letters Patent is hereby corrected as shown below:

Column 6
Line 21, change "terminal (Ip) of the receiver circuit," to --terminal (Ip) 503 of the receiver circuit 504,--

Column 7
Line 16, change "work R3" to --work R53--
Line 26, change "power supply dd" to --power supply Vdd--
Line 45, change "Q522 and resistor R513" to --Q523 and resistor R513--
Line 56, change "bias current source (Q23, R13)" to --bias current source (Q523, R513)"--

Column 8
Line 8, change "transistors Q20 and Q521" to --transistors Q520 and Q521--

Signed and Sealed this
First Day of May, 2012

David J. Kappos
*Director of the United States Patent and Trademark Office*